(12) United States Patent
Huang

(10) Patent No.: US 9,635,721 B2
(45) Date of Patent: Apr. 25, 2017

(54) LED PACKAGE STRUCTURE WITH AN INTEGRATED PIN TO TRANSMIT OPERATION POWER AND CONTROL SIGNALS

(71) Applicant: Hsien-Jung Huang, New Taipei (TW)

(72) Inventor: Hsien-Jung Huang, New Taipei (TW)

( * ) Notice: Subject to any disclaimer, the term of this patent is extended or adjusted under 35 U.S.C. 154(b) by 70 days.

(21) Appl. No.: 14/836,250

(22) Filed: Aug. 26, 2015

(65) Prior Publication Data
US 2017/0064784 A1   Mar. 2, 2017

(51) Int. Cl.
H01L 25/07   (2006.01)
H01L 33/32   (2010.01)
H01L 33/50   (2010.01)
H05B 33/08   (2006.01)
H05B 33/06   (2006.01)

(52) U.S. Cl.
CPC ......... H05B 33/0821 (2013.01); H05B 33/06 (2013.01); H05B 33/0842 (2013.01)

(58) Field of Classification Search
None
See application file for complete search history.

(56) References Cited

U.S. PATENT DOCUMENTS

| | | | | |
|---|---|---|---|---|
| 2009/0294782 A1* | 12/2009 | Peng | ............. | F21V 19/0025 257/89 |
| 2010/0182225 A1* | 7/2010 | Huang | ............. | G09G 3/32 345/83 |
| 2012/0187856 A1* | 7/2012 | Huang | ............. | H01L 25/167 315/210 |

* cited by examiner

*Primary Examiner* — Dedei K Hammond

(57) ABSTRACT

A LED package structure is provided. The LED package includes a three-element red-green-blue (RGB) light emitting diode (LED). The carrier of the LED package has a power input pin and a ground pin and the pins form extension portions inside the carrier. The driver element, a red dice, a green dice, and a blue dice are disposed within the carrier. The driver element controls the red, green and blue LED dices by receiving an operation power and a PWM (Pulse Width Modulation) signal from the power input pin. By this arrangement, the LED package with compact structure, good mixing effect, and high resolution is achieved. Furthermore, the using space is saved and the PIN number is reduced to allow mass production with low costs.

18 Claims, 7 Drawing Sheets

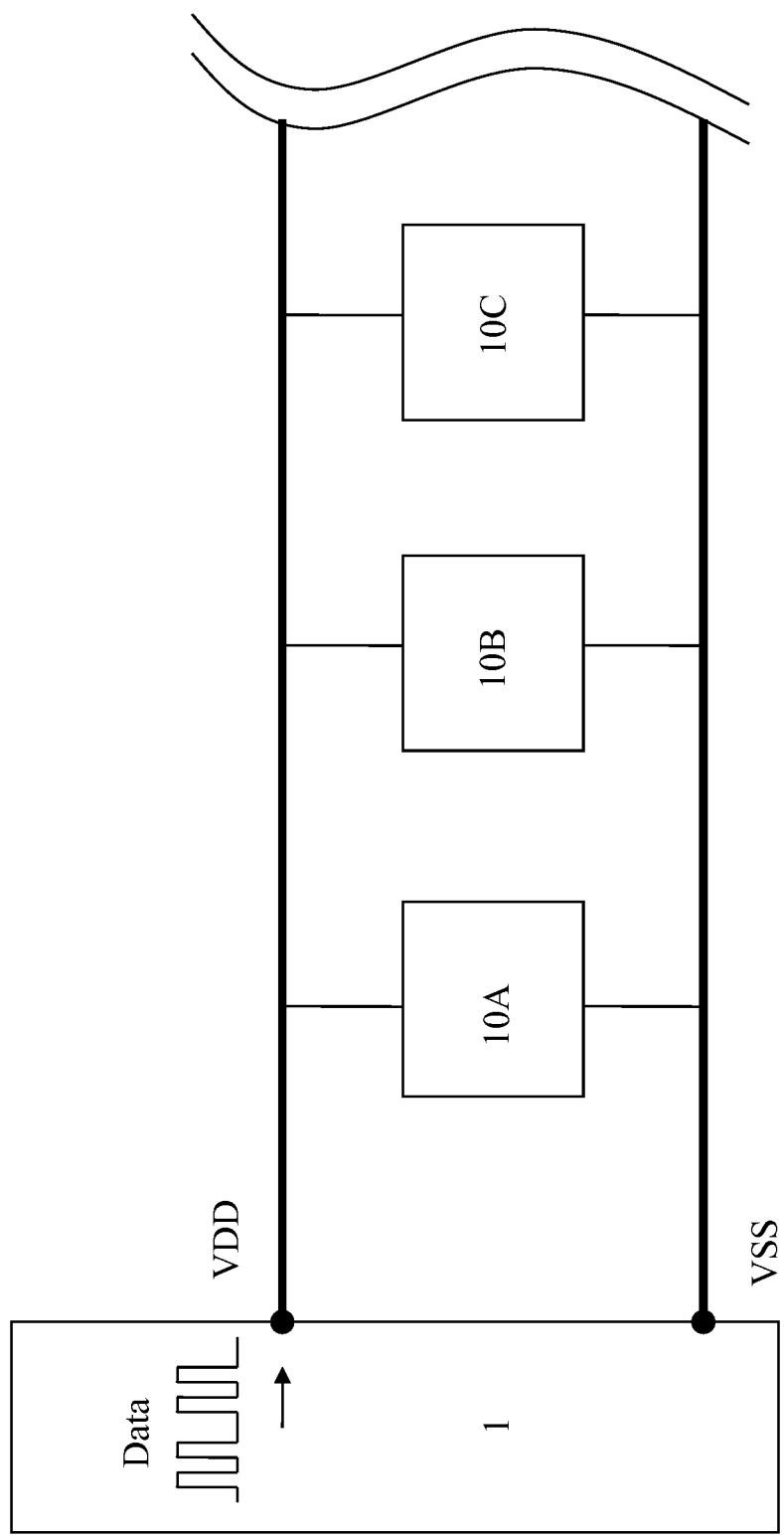

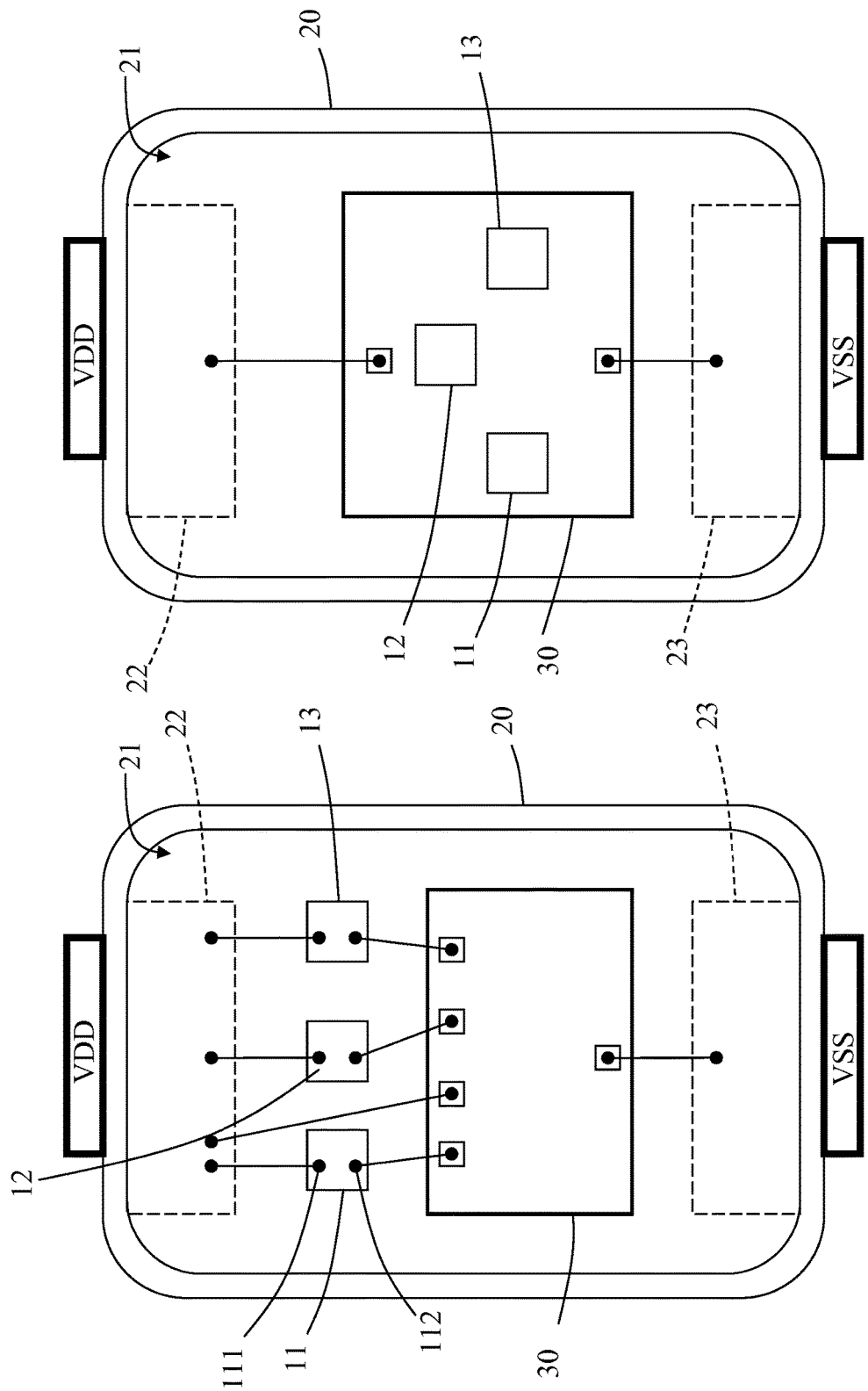

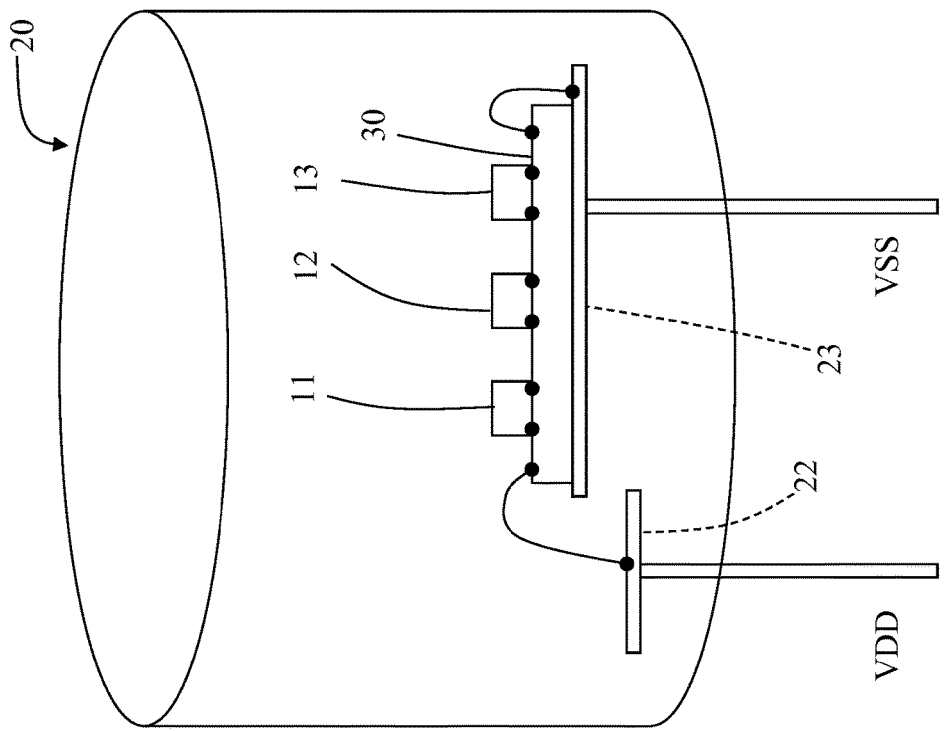
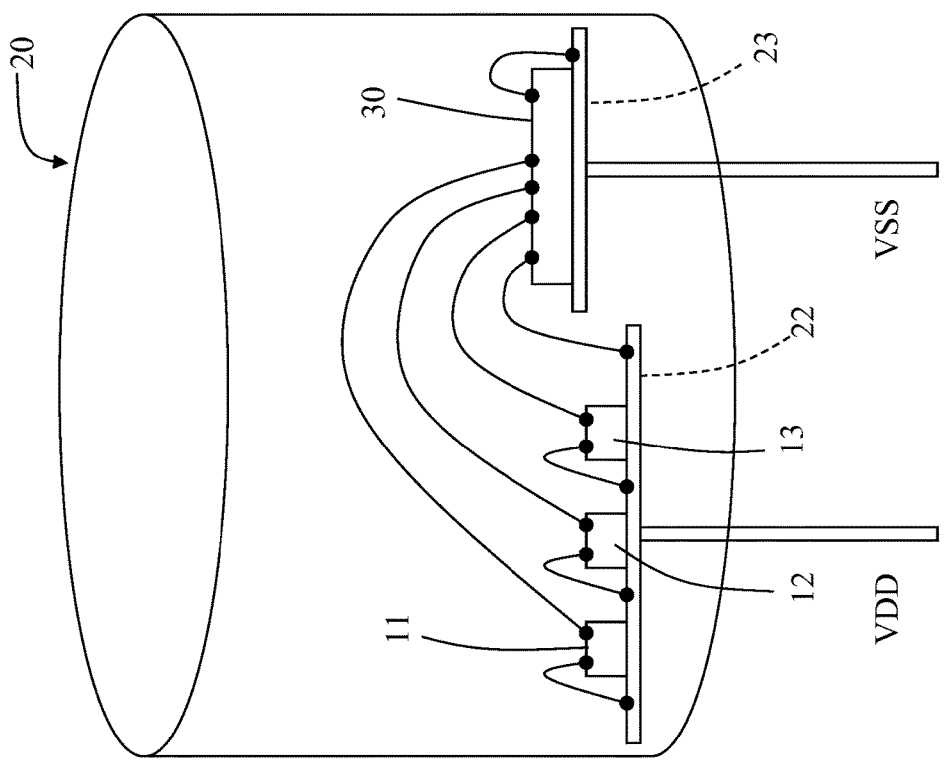

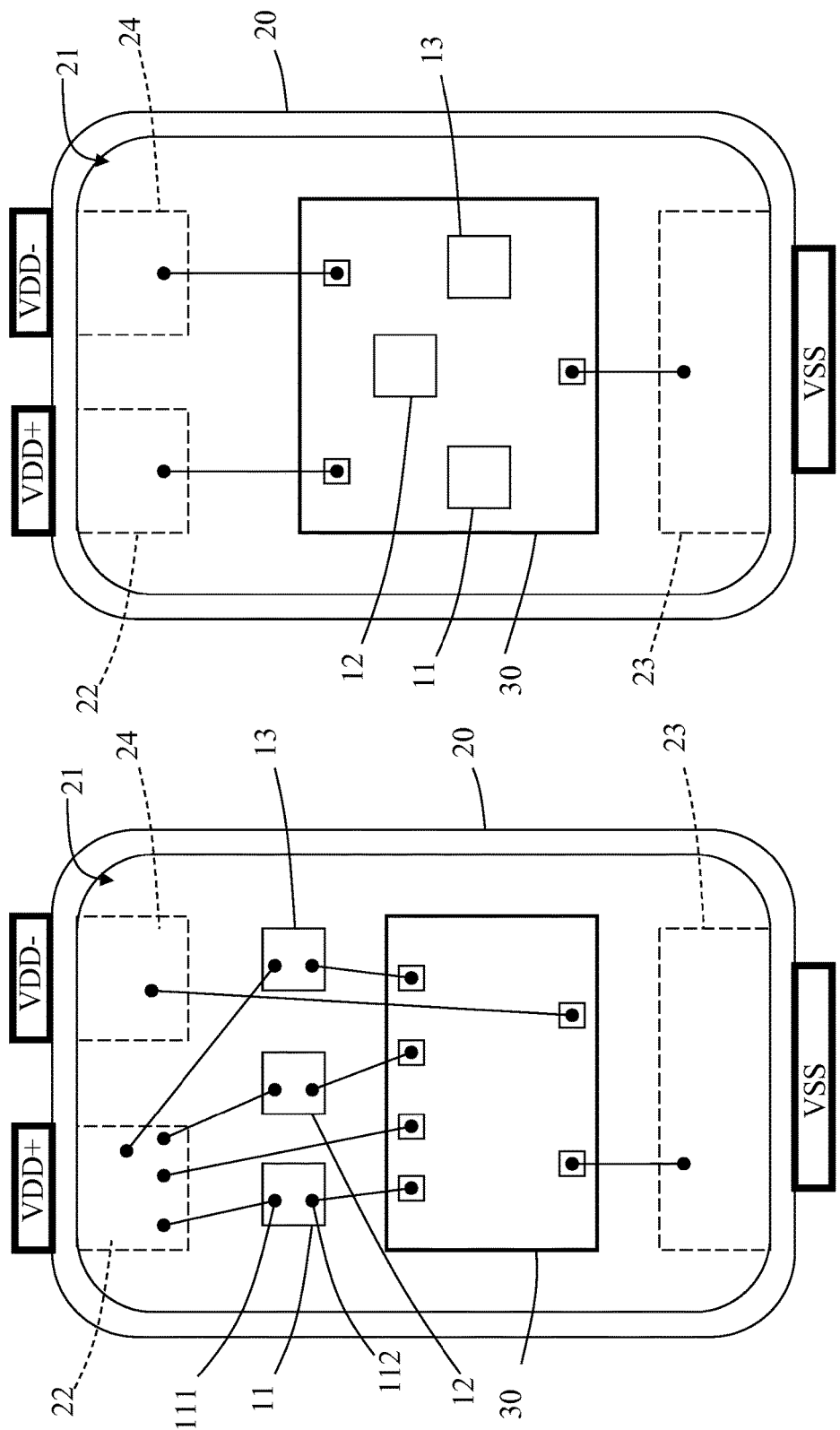

LED PACKAGE STRUCTURE WITH AN INTEGRATED PIN TO TRANSMIT OPERATION POWER AND CONTROL SIGNALS

BACKGROUND OF THE INVENTION

Field of the Invention

The present invention relates to a package structure of full-color LED (Light Emitting Diode) adapted to various LED display systems with saved using space, and more particularly, to a package structure of LED with an integrated pin to transmit operation power and control signals.

Related Art

Light plays a significant role for a very long time in human life. Accompanying with the constant progresses of science and technology, LED (Light Emitting Diode) has been invented in 1970s. With the advantages of compact size, long lifetime, low breakage, low power consumption, no heat radiation and no toxic pollution (such as mercury and etc.), comparing with conventional light sources, LED is now broadly utilized in our daily life.

Through the environment/economization policies driven by the governments around the world, LED is well-developed and applied to two major applications including display and illumination functions. Due to plenty of nonstop technology advancements, the conventional single-color LED is gradually unable to satisfy human's visual needs. Consequently, advanced LED products such as bicolor LED and full-color LED are developed afterwards.

To display every color perfectly, the package structure of the conventional full-color LED at least includes a red LED dice, a green LED dice and a blue LED dice configured therein, so that the tree primary color lights, red, green and blue lights may be used to mix and generate various colors of light. However, every color light needs different mixing ratio of the three primary color lights so the full-color LED needs to collocate with externally connected current limiting resistor(s) and driving element(s) and control the mixing ratio of the tree red, green and blue primary color lights.

In the prior art, the full-color LED has to include at least six pins including the power input pin, the power output pin, the clock input pin, the clock output pin, the serial data input pin and the serial data output pin. Therefore, in the limited space of the full-color LED, it is difficult to achieve mass production with low costs and high production yield rate.

SUMMARY OF THE INVENTION

To solve the aforesaid problems of the prior art, the present invention provides an LED (Light Emitting Diode) package structure with reduced PIN numbers to allow mass production with low costs.

Accordingly, the present invention discloses an LED package structure. The LED package structure in the present invention includes a carrier, at least one group of pins, and a driver element. The carrier has an inner space to dispose a red LED dice, a green LED dice and a blue LED dice. Each of the red, green and blue LED dices is respectively configured with a first electrode and a second electrode thereon. The pins are exposed outside of the carrier, and each group of pins includes a power input pin and a ground pin. And each of the power input pin and the ground pin has an extension portion extended inside of the carrier, wherein the first electrode of each of the red, green and blue LED dices is connected to the extension portion of the power input pin. The driver element is pasted inside the carrier and respectively connected with the second electrode of each of the red, green and blue LED dices by using bonding wires. The driver element controls the red, green and blue LED dices after receiving an operation power and a PWM (Pulse Width Modulation) signal from the power input pin.

It is another object of this invention to provide an LED package structure. The LED package structure in the present invention includes a carrier, at least one group of pins, and a driver element. The carrier has an inner space to dispose a red LED dice, a green LED dice and a blue LED dice. The pins are exposed outside of the carrier, and each group of pins includes a power input pin and a ground pin. And each of the power input pin and the ground pin has an extension portion extended inside of the carrier. The driver element is pasted inside the carrier and the LED dices are pasted on the driver element to form electrical connections with the driver element. The driver element controls the red, green and blue LED dices after receiving an operation power and a PWM (Pulse Width Modulation) signal from the power input pin.

On the other hand, the driver element is adapted to generate an identification number by blowing at least one metal fuse of an encoder.

These and other features, aspects, and advantages of the present invention will become better understood with reference to the following description and appended claims. It is to be understood that both the foregoing general description and the following detailed description are examples, and are intended to provide further explanation of the invention as claimed.

BRIEF DESCRIPTION OF THE DRAWINGS

The present invention will become more fully understood from the detailed description given herein below for illustration only, and thus is not limitative of the present invention, and wherein:

FIG. 1 is a schematic view of a first embodiment of an LED display system according to the present invention;

FIG. 2A is a schematic view of a first embodiment of an LED package structure according to the present invention;

FIG. 2B is a schematic view of another example of the first embodiment of an LED package structure according to the present invention;

FIG. 3A is a schematic view of a second embodiment of an LED package structure according to the present invention;

FIG. 3B is a schematic view of another example of the second embodiment of an LED package structure according to the present invention;

FIG. 5A is a schematic view of a third embodiment of an LED package structure according to the present invention;

FIG. 5B is a schematic view of another example of a third embodiment of an LED package structure according to the present invention;

DETAILED DESCRIPTION OF THE INVENTION

Figure 4:
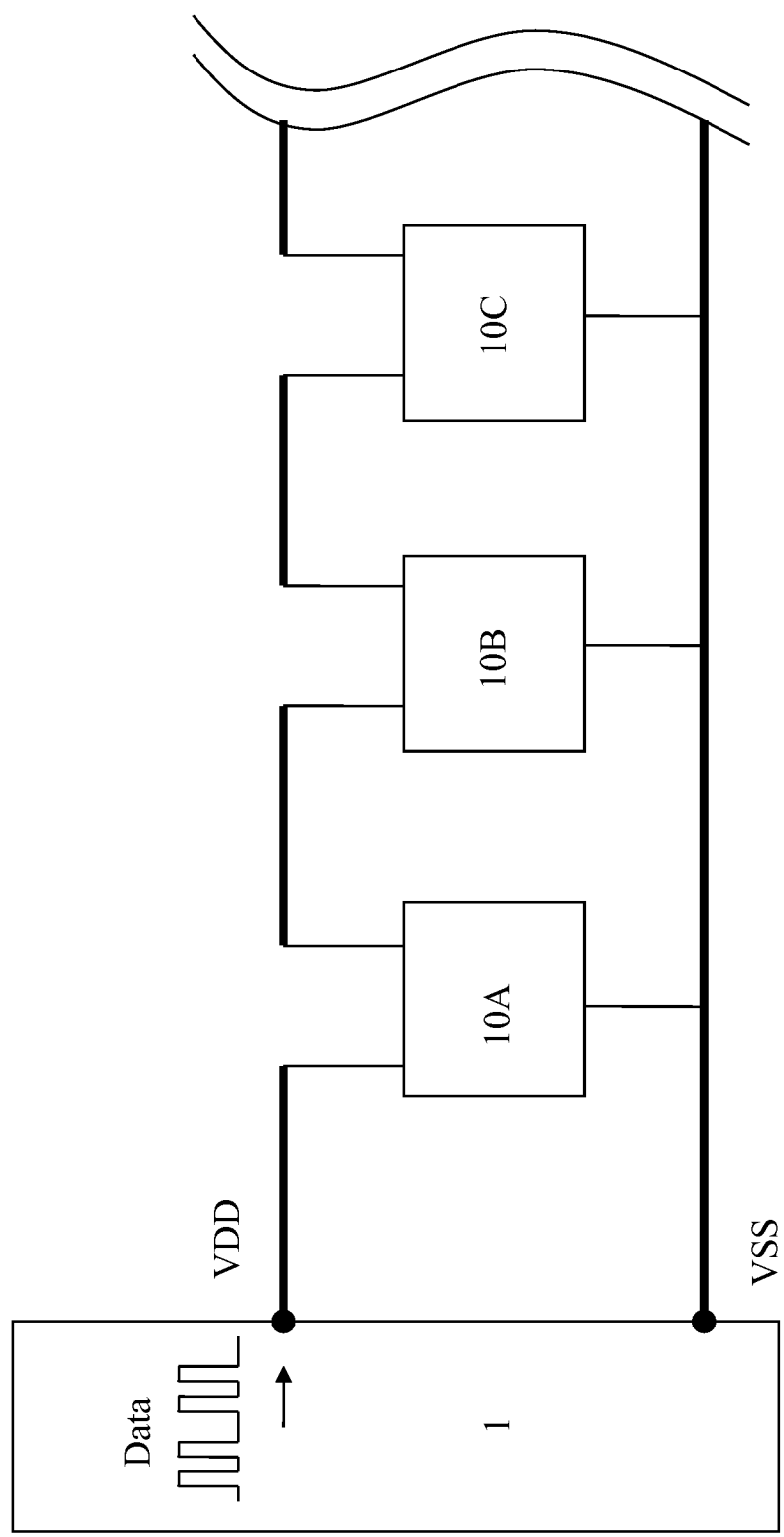
FIG. 4 is a schematic view of a second embodiment of an LED display system according to the present invention.

Reference will now be made in detail to the present preferred embodiments of the invention, examples of which are illustrated in the accompanying drawings. Wherever possible, the same reference numbers are used in the drawings and the description refers to the same or the like parts.

Please refer to FIG. 1, which is a schematic view of a first embodiment of an LED display system according to the present invention.

The LED display system of this invention includes a main control 1 and a plurality of LED (Light Emitting Diode) 10A, 10B, and 10C, which connected in parallel. The main control 1 is used to generate an operation power and a PWM (Pulse Width Modulation) signal Data to the LEDs 10A, 10B, and 10C. As shown in FIG. 1, the main control 1 may only include a power input pin VDD and a ground pin VSS to control the LEDs 10A, 10B, and 10C. The operation power and the PWM signal Data are transmitted from the power input pin VDD.

FIG. 2A is a schematic view of a first embodiment of an LED package structure according to the present invention.

The LED package structure in the present invention includes a carrier 20, at least one group of pins, and a driver element 30. The carrier 20 has an inner space 21 to dispose a red LED dice 11, a green LED dice 12 and a blue LED dice 13. Each of the red, green and blue LED dices 11, 12, and 13 is respectively configured with a first electrode 111 and a second electrode 112 thereon. The pins are exposed outside of the carrier 20, and each group of pins includes a power input pin VDD and a ground pin VSS. And each of the power input pin VDD and the ground pin VSS has an extension portion 22, 23 extended inside of the carrier 20. The first electrode 111 of each of the red, green and blue LED dices 11, 12, and 13 is connected to the extension portion 22 of the power input pin VDD. The driver element 30 is pasted inside the carrier 20 and respectively connected with the second electrode 112 of each of the red, green and blue LED dices 11, 12, and 13 by using bonding wires. And the driver element 30 is connected to the extension portions 22, 23 of the power input pin VDD and the ground pin VSS. Then, the light-mixing glue of light-pervious material is feed to complete the package. The driver element 30 may control the red, green and blue LED dices 11, 12, and 13 after receiving an operation power and a PWM (Pulse Width Modulation) signal from the power input pin VDD.

FIG. 2B is a schematic view of another example of the first embodiment of an LED package structure according to the present invention.

In this embodiment, the red, green and blue LED dices 11, 12, and 13 are pasted on the driver element 30 directly to form electrical connections with the driver element. Therefore, the amount of bonding wires is reduced.

FIG. 3A is a schematic view of a second embodiment of an LED package structure according to the present invention.

The LED package structure includes a power input pin VDD and a ground pin VSS. The driver element 30 is pasted on the frame-type extension portion 23 of the ground pin VSS. And the red, green and blue LED dices 11, 12, and 13 are pasted on the frame-type extension portion 22 of the power input pin VDD. The light-mixing glue of light-pervious material is feed to complete the bulb-type package.

FIG. 3B is a schematic view of another example of the second embodiment of an LED package structure according to the present invention. In this embodiment, the red, green and blue LED dices 11, 12, and 13 are pasted on the driver element 30 directly to form electrical connections with the driver element. Therefore, the amount of bonding wires is reduced.

Please refer to FIG. 4, which is a schematic view of a second embodiment of an LED display system according to the present invention.

The LED display system of this invention includes a main control 1 and a plurality of LED (Light Emitting Diode) 10A, 10B, and 10C, which connected in serial. The main control 1 is used to generate an operation power and a PWM (Pulse Width Modulation) signal Data to the LEDs 10A, 10B, and 10C. As shown in FIG. 1, the main control 1 may only include a power input pin VDD and a ground pin VSS to control the LEDs 10A, 10B, and 10C. The operation power and the PWM signal Data are transmitted from the power input pin VDD. A driver element controls the red, green and blue LED dices 10A, 10B, and 10C after receiving the operation power and the PWM signal from the power input pin. Then, the operation power and the PWM signal are transmitted out to next LED dices.

FIG. 5A is a schematic view of a third embodiment of an LED package structure according to the present invention.

Each group of pins includes a power input pin VDD+, a power output pin VDD− and a ground pin VSS. And each of the power input pin VDD+, the power output pin VDD− and the ground pin VSS has an extension portion 22, 23, and 24 extended inside of the carrier 20. The first electrode 111 of each of the red, green and blue LED dices 11, 12, and 13 is connected to the extension portion 22 of the power input pin VDD+. The driver element 30 is pasted inside the carrier 20 and respectively connected with the second electrode 112 of each of the red, green and blue LED dices 11, 12, and 13 by using bonding wires. And the driver element 30 is connected to the extension portions 22, 23, and 24 of the power input pin VDD+, the power output pin VDD− and the ground pin VSS. Then, the light-mixing glue of light-pervious material is feed to complete the package. The driver element 30 may control the red, green and blue LED dices 11, 12, and 13 after receiving an operation power and a PWM (Pulse Width Modulation) signal from the power input pin VDD+. Then, the operation power and the PWM signal are transmitted out from the power output pin VDD−.

FIG. 5B is a schematic view of another example of the third embodiment of an LED package structure according to the present invention. In this embodiment, the red, green and blue LED dices 11, 12, and 13 are pasted on the driver element 30 directly to form electrical connections with the driver element. Therefore, the amount of bonding wires is reduced.

Figure 6A:
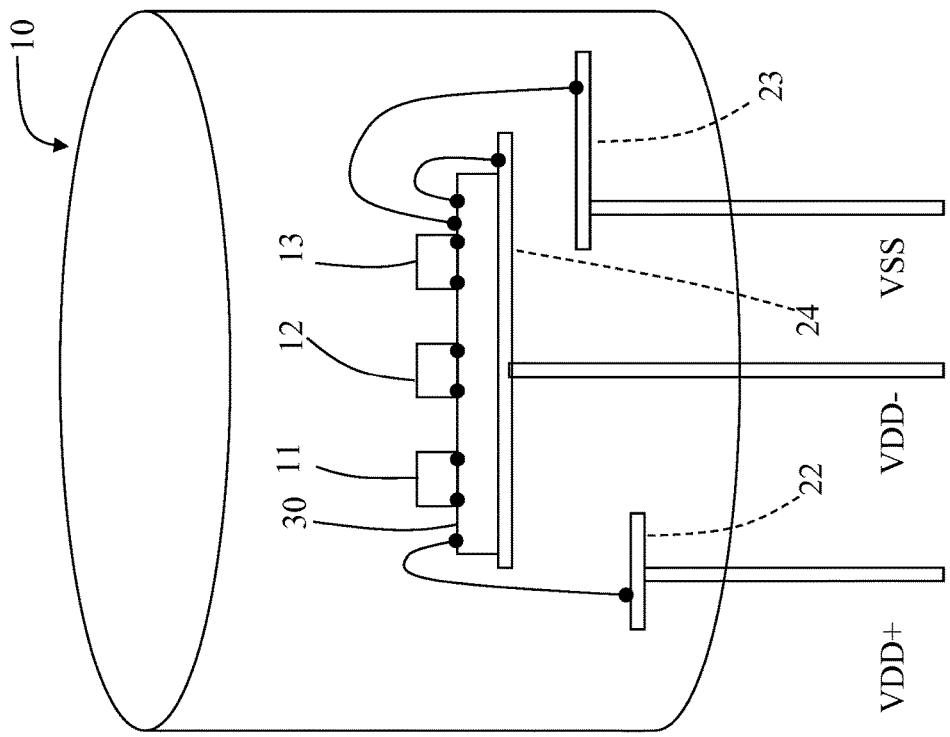
FIG. 6A is a schematic view of a fourth embodiment of an LED package structure according to the present invention.
Figure 6B:
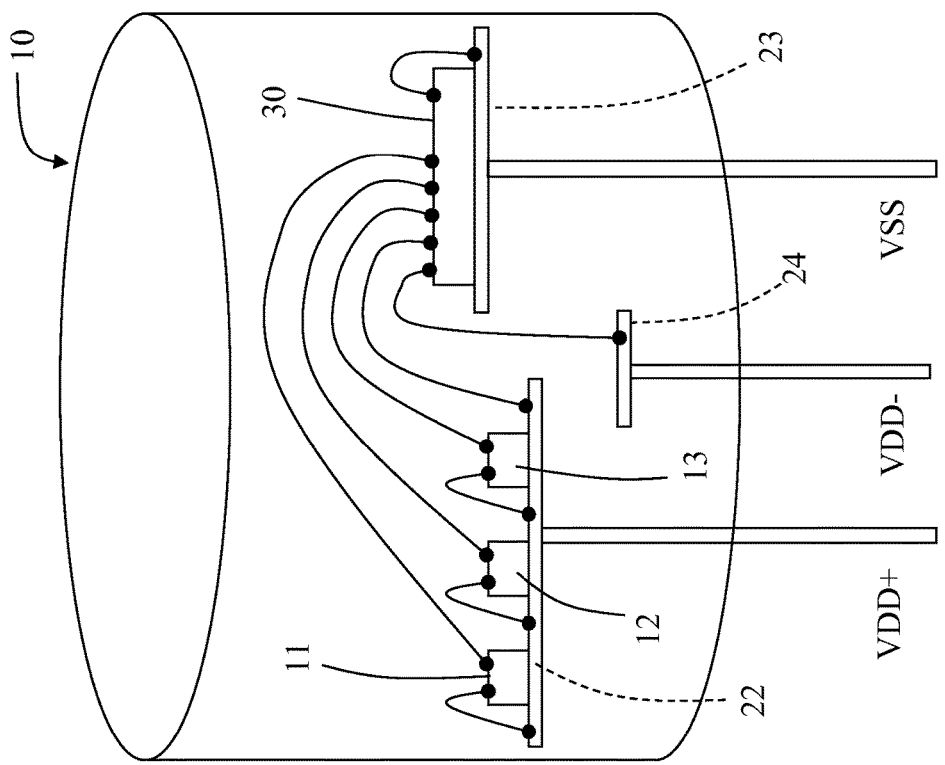
FIG. 6B is a schematic view of another example of the fourth embodiment of an LED package structure according to the present invention.

FIG. 6A is a schematic view of a fourth embodiment of an LED package structure according to the present invention.

The LED package structure includes a power input pin VDD+, a power output pin VDD− and a ground pin VSS. The driver element 30 is pasted on the frame-type extension portion 23 of the ground pin VSS. And the red, green and blue LED dices 11, 12, and 13 are pasted on the frame-type extension portion 22 of the power input pin VDD+. The light-mixing glue of light-pervious material is feed to complete the bulb-type package.

FIG. 3B is a schematic view of another example of the fourth embodiment of an LED package structure according to the present invention. In this embodiment, the red, green and blue LED dices 11, 12, and 13 are pasted on the driver element 30 directly to form electrical connections with the driver element. Therefore, the amount of bonding wires is reduced.

Figure 7:
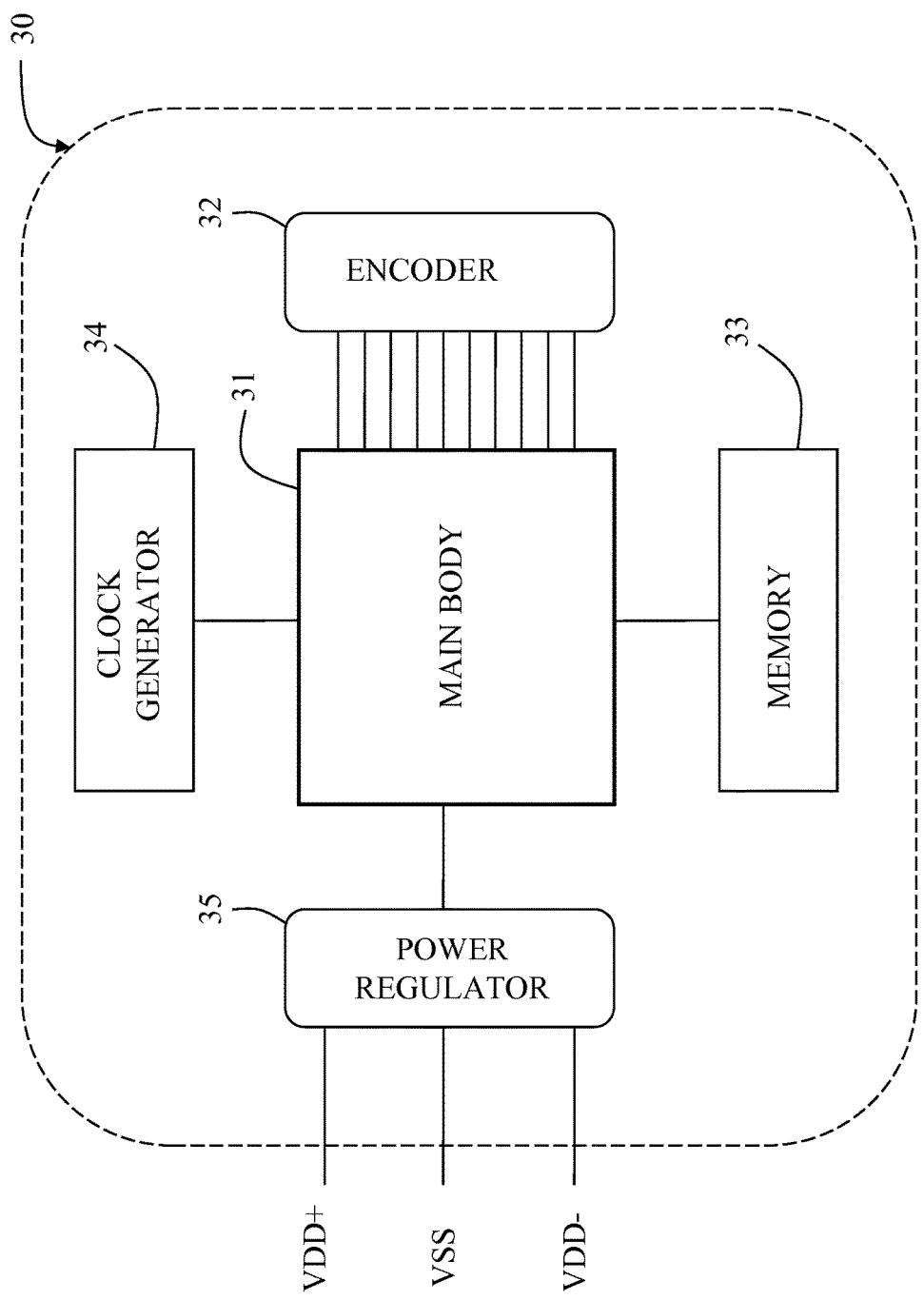
FIG. 7 is a schematic view of a driver element of an LED display system according to the present invention.

FIG. 7 is a schematic view of a driver element of an LED display system according to the present invention.

The driver element 30 includes a main body 31, an encoder 32, a memory 33 and a clock generator 34. The encoder 32 is adapted to generate an identification number for the LED. The main body 31 is connected to the encoder 32 and adapted to adjust a mixing proportion of the LED dices according to the PWM signal. The memory 33 is connected to the main body 31 and adapted to store an identification number of at least one adjacent LED. The clock generator 34 is connected to the main body 31 and adapted to generate an oscillator clock signal for synchronizing with the adjacent LED.

The identification number is generated by blowing at least one metal fuse of the encoder 32. That is similar to the structure of Fuse based Programmable Read Only Memories (PROMs). The identification number is unique. The main body 31 may acquire the identification number stored in the memory 33 to obtain the location of all the adjacent LEDs. The driver element 30 may further include a power regulator 35 to modify the operation power.

Accordingly, the LED package structure may be connected together, either in parallel or in serial, to form a larger LED display or light string. Due to the LED only has two pins, the intervals between the adjacent full-color LEDs so that the distance in-between is effectively shortened and a large-scale display screen may display finer images. Therefore, the display system with compact structure, good mixing effect, and high resolution is achieved. Furthermore, the using space is saved and the PIN number is reduced to allow mass production with low costs.

Additional advantages and modifications will readily occur to those proficient in the relevant fields. The invention in its broader aspects is therefore not limited to the specific details and representative embodiments shown and described herein. Accordingly, various modifications may be made without departing from the spirit or scope of the general inventive concept as defined by the appended claims and their equivalents.

What is claimed is:

1. A LED (Light Emitting Diode) package structure, comprising:
    a carrier having an inner space to dispose a red LED dice, a green LED dice and a blue LED dice, each of the red, green and blue LED dices being respectively configured with a first electrode and a second electrode thereon;
    at least one group of pins exposed outside of the carrier, each group of pins includes a power input pin and a ground pin, and each of the power input pin and the ground pin has an extension portion extended inside of the carrier, wherein the first electrode of each of the red, green and blue LED dices is connected to the extension portion of the power input pin; and
    a driver element, being pasted inside the carrier and respectively connecting with the second electrode of each of the red, green and blue LED dices by using bonding wires, the driver element controlling the red, green and blue LED dices after receiving an operation power and a PWM (Pulse Width Modulation) signal from the power input pin.

2. The LED package structure of claim 1, wherein the driver element sends out the operation power and the PWM signal through the ground pin.

3. The LED package structure of claim 1, wherein each group of pins further includes a power output pin, and the power output pin has an extension portion extended inside of the carrier.

4. The LED package structure of claim 3, wherein the driver element sends out the operation power and the PWM signal through the power output pin.

5. The LED package structure of claim 1, wherein the driver element comprising:
    an encoder, adapted to generate an identification number;
    a main body, connected to the encoder and adapted to adjust a mixing proportion of the LED dices according to the PWM signal;
    a memory, connected to the main body; and
    a clock generator, connected to the main body and adapted to generate an oscillator clock signal.

6. A LED (Light Emitting Diode) package structure, comprising:
    a carrier having an inner space to dispose a red LED dice, a green LED dice and a blue LED dice, each of the red, green and blue LED dices;
    at least one group of pins exposed outside of the carrier, each group of pins includes a power input pin and a ground pin, and each of the power input pin and the ground pin has an extension portion extended inside of the carrier; and
    a driver element, being pasted inside the carrier and the LED dices being pasted on the driver element and form electrical connections with the driver element, the driver element controlling the red, green and blue LED dices after receiving an operation power and a PWM (Pulse Width Modulation) signal from the power input pin.

7. The LED package structure of claim 6, wherein the driver element sends out the operation power and the PWM signal through the ground pin.

8. The LED package structure of claim 6, wherein each group of pins further includes a power output pin, and the power output pin has an extension portion extended inside of the carrier.

9. The LED package structure of claim 8, wherein the driver element sends out the operation power and the PWM signal through the power output pin.

10. The LED package structure of claim 6, wherein the driver element comprising:
    an encoder, adapted to generate an identification number;
    a main body, connected to the encoder and adapted to adjust a mixing proportion of the LED dices according to the PWM signal;
    a memory, connected to the main body; and
    a clock generator, connected to the main body and adapted to generate an oscillator clock signal.

11. A LED (Light Emitting Diode) display system, comprising:
    a main controller, generating an operation power and a PWM (Pulse Width Modulation) signal; and
    a plurality of LEDs, each LED comprising:
        a carrier having an inner space to dispose a red LED dice, a green LED dice and a blue LED dice, each of the red, green and blue LED dices being respectively configured with a first electrode and a second electrode thereon;
        at least one group of pins exposed outside of the carrier, each group of pins includes a power input pin and a ground pin, and each of the power input pin and the ground pin has an extension portion extended inside of the carrier; and
        a driver element, being pasted inside the carrier and respectively connecting with the red, green and blue LED dices, the driver element controlling the red, green and blue LED dices after receiving an operation power and a PWM (Pulse Width Modulation) signal from the power input pin.

12. The LED display system of claim 11, wherein the driver element sends out the operation power and the PWM signal through the ground pin to an adjacent LED.

13. The LED display system of claim 11, wherein each group of pins further includes a power output pin, and the power output pin has an extension portion extended inside of the carrier.

14. LED display system of claim 13, wherein the driver element sends out the operation power and the PWM signal through the power output pin to an adjacent LED.

15. The LED display system of claim 11, wherein the first electrode of each of the red, green and blue LED dices is connected to the extension portion of the power input pin, and the driver element respectively connecting with the second electrode of each of the red, green and blue LED dices by using bonding wires.

16. The LED display system of claim 11, wherein the LED dices being pasted on the driver element and form electrical connections with the driver element.

17. The LED display system of claim 11, wherein the driver element comprising:

an encoder, adapted to generate an identification number for the LED;

a main body, connected to the encoder and adapted to adjust a mixing proportion of the LED dices according to the PWM signal;

a memory, connected to the main body and adapted to store an identification number of an adjacent LED; and a clock generator, connected to the main body and adapted to generate an oscillator clock signal for synchronizing with the adjacent LED.

18. The driver element of claim 17, wherein the identification number is generated by blowing at least one metal fuse of the encoder.

* * * * *